United States Patent
Ohashi et al.

(10) Patent No.: US 9,812,529 B2
(45) Date of Patent: Nov. 7, 2017

(54) SEMICONDUCTOR DEVICE AND METHOD FOR MANUFACTURING THE SAME

(71) Applicant: Kabushiki Kaisha Toshiba, Minato-ku (JP)

(72) Inventors: Teruyuki Ohashi, Kawasaki (JP); Tatsuo Shimizu, Shinagawa (JP); Ryosuke Iijima, Setagaya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/048,348

(22) Filed: Feb. 19, 2016

(65) Prior Publication Data

US 2016/0247884 A1    Aug. 25, 2016

(30) Foreign Application Priority Data

Feb. 24, 2015 (JP) .................. 2015-033596

(51) Int. Cl.

| H01L 29/34 | (2006.01) |
| --- | --- |
| H01L 29/16 | (2006.01) |
| H01L 29/49 | (2006.01) |
| H01L 29/66 | (2006.01) |
| H01L 29/51 | (2006.01) |
| H01L 29/167 | (2006.01) |
| H01L 21/04 | (2006.01) |
| H01L 21/265 | (2006.01) |
| H01L 29/739 | (2006.01) |
| H01L 21/324 | (2006.01) |

(52) U.S. Cl.
CPC ........ *H01L 29/1608* (2013.01); *H01L 21/045* (2013.01); *H01L 21/049* (2013.01); *H01L 21/26506* (2013.01); *H01L 29/167* (2013.01); *H01L 29/34* (2013.01); *H01L 29/4916* (2013.01); *H01L 29/51* (2013.01); *H01L 29/518* (2013.01); *H01L 29/66068* (2013.01); *H01L 29/7395* (2013.01); *H01L 21/324* (2013.01)

(58) Field of Classification Search
CPC ................................................... H01L 29/1608
See application file for complete search history.

(56) References Cited

U.S. PATENT DOCUMENTS

| 5,712,208 A * | 1/1998 | Tseng ................ H01L 21/28035 |
| | | 257/E21.194 |
| 2004/0142518 A1* | 7/2004 | Yu .................... H01L 21/26506 |
| | | 438/197 |
| 2015/0303271 A1* | 10/2015 | Tanaka .................... H01L 21/28 |
| | | 257/77 |

FOREIGN PATENT DOCUMENTS

| JP | 2007-53227 | 3/2007 |
| JP | 2014-103175 | 6/2014 |

* cited by examiner

*Primary Examiner* — Fernando L Toledo
*Assistant Examiner* — Valerie N Newton
(74) *Attorney, Agent, or Firm* — Oblon, McClelland, Maier & Neustadt, L.L.P.

(57) ABSTRACT

A semiconductor device of an embodiment includes a SiC layer, a gate electrode, a gate insulating layer provided between the SiC layer and the gate electrode, and a first region provided between the SiC layer and the gate insulating layer and having a peak of nitrogen (N) concentration distribution and a peak of fluorine (F) concentration distribution.

15 Claims, 11 Drawing Sheets

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2015-033596, filed on Feb. 24, 2015, the entire contents of which are incorporated herein by reference.

FIELD

Embodiments described herein relate generally to a semiconductor device and a method for manufacturing the same.

BACKGROUND

Silicon carbide (SiC) is expected to be a material for a next-generation semiconductor device. SiC has excellent physical properties, such as a triple the band gap, about ten times the breakdown field strength, and about triple the thermal conductivity of silicon (Si). By utilizing the characteristics, a semiconductor device that is low loss and capable of operating at high temperature can be implemented.

However, when a metal insulator semiconductor (MIS) structure is formed using SiC, the amount of interface state existing between a semiconductor and an insulating film is larger than Si. Consequently, charge mobility is reduced, and which causes a problem that on-resistance of a metal insulator semiconductor field effect transistor (MISFET) or an insulated gate bipolar transistor (IGBT) becomes high.

DETAILED DESCRIPTION

A semiconductor device of an embodiment includes a SiC layer, a gate electrode, a gate insulating layer provided between the SiC layer and the gate electrode, and a first region provided between the SiC layer and the gate insulating layer, the first region having a peak of nitrogen (N) concentration distribution and a peak of fluorine (F) concentration distribution.

Hereinafter, embodiments of the present disclosure will be described with reference to the drawings. Note that, in the following description, the same reference signs are assigned to the same members and the like, and the description of the member that has been described will be appropriately omitted.

In the following description, $n^+$, n, and $n^-$, or $p^+$, p, and $p^-$ represent relative levels of impurity concentration in each conductive type. That is, $n^+$ has a relatively higher n-type impurity concentration than n, and $n^-$ has a relatively lower n-type impurity concentration than n. $p^+$ has a relatively higher $p^-$ type impurity concentration than p, and $p^-$ has a relatively lower p-type impurity concentration than p. Note that, an $n^+$-type and an $n^-$-type will be also simply referred to as an n-type, and a $p^+$-type and a $p^-$-type will be also simply referred to as a p-type.

(First Embodiment)

A semiconductor device of the present embodiment includes a SiC layer, a gate electrode, agate insulating layer provided between the SiC layer and the gate electrode, and a first region provided between the SiC layer and the gate insulating layer and having a peak of nitrogen (N) concentration distribution and a peak of fluorine (F) concentration distribution.

Hereinafter, the above first region will be referred to as a first interface region for convenience sake.

Figure 1:
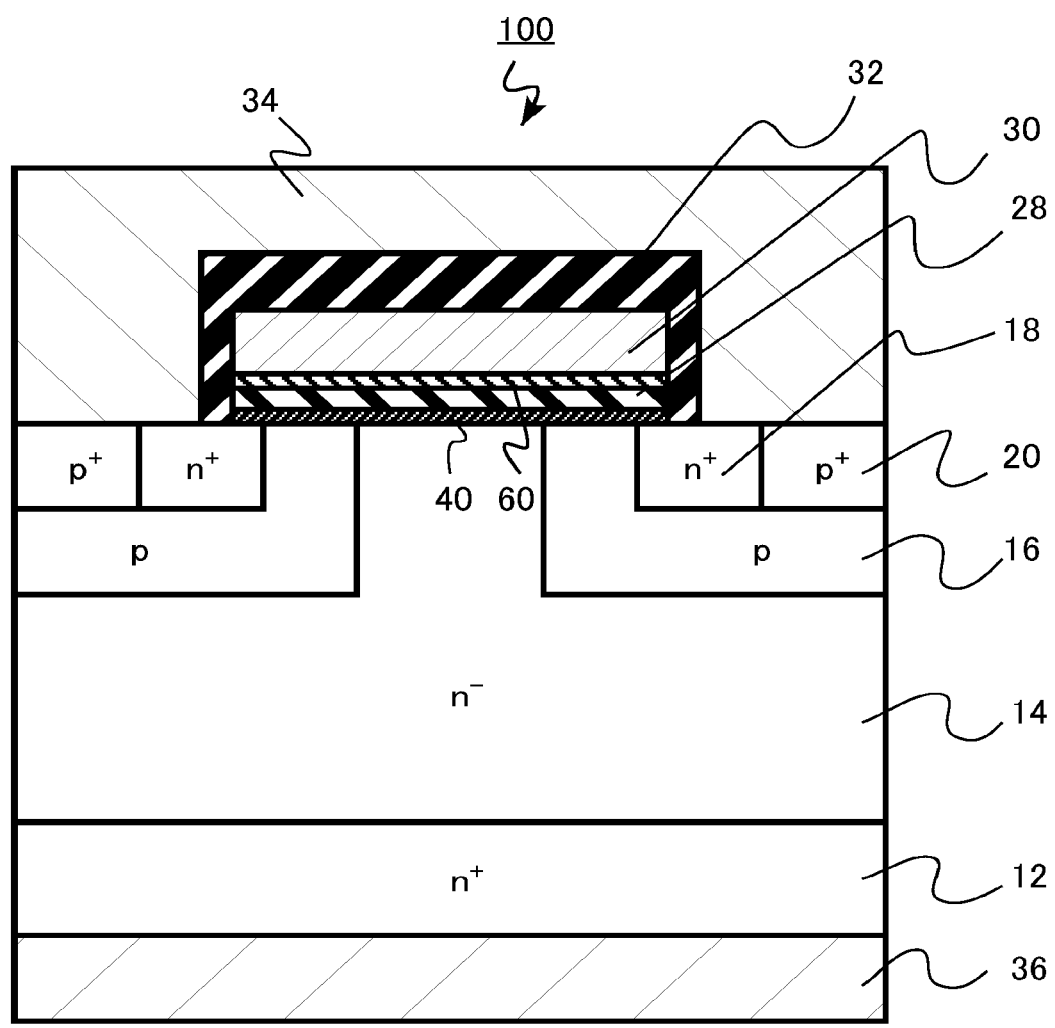
FIG. 1 is a schematic sectional view illustrating a semiconductor device of a first embodiment.

FIG. 1 is a schematic sectional view illustrating a MISFET that is the semiconductor device of the present embodiment. A MISFET 100 is a double implantation MOSFET (DIMOSFET) that forms a p-well region and a source region by ion implantation.

The MISFET 100 includes an $n^+$-type SiC substrate 12 having a first face and a second face. In FIG. 1, the first face is an upper face of the diagram, and the second face is a lower face of the diagram.

The SiC substrate 12 is a 4H—SiC substrate including, for example, nitrogen (N) as an n-type impurity, and the impurity concentration is, for example, $1 \times 10^{18}$ cm$^{-3}$ or more and $1 \times 10^{20}$ cm$^{-3}$ or less.

Figure 2:
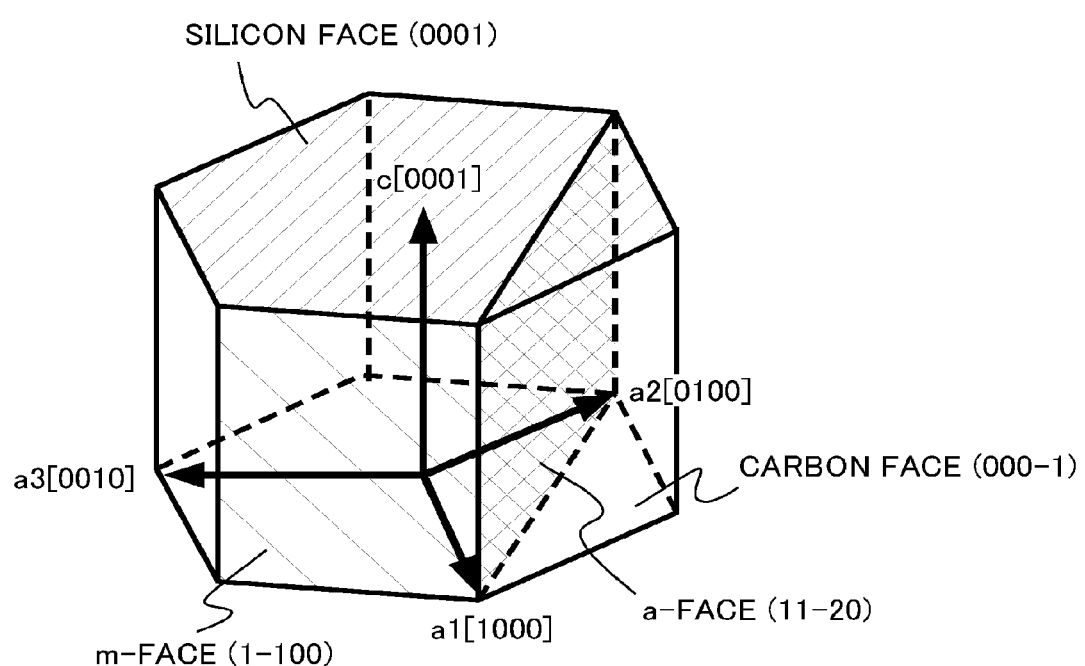
FIG. 2 is a diagram illustrating a crystal structure of SiC of the first embodiment.

FIG. 2 is a diagram illustrating a crystal structure of SiC. The representative crystal structure of SiC is a hexagonal crystal system, such as 4H—SiC. A face having a c-axis along the axial direction of the hexagonal prism as a normal line (the top face of the hexagonal prism) is a (0001) face. The face equivalent to the (0001) face is referred to as a silicon face (Si-face) and indicated as a {0001} face. Silicon (Si) atoms are arranged on the silicon face.

The other face having the c-axis along the axial direction of the hexagonal prism as the normal line (the top face of the hexagonal prism) is a (000-1) face. The face equivalent to the (000-1) face is referred to as a carbon face (C-face) and indicated as a {000-1} face. Carbon (C) atoms are arranged on the carbon face.

Meanwhile, a side face (prismatic face) of the hexagonal prism is an m-face equivalent to a (1-100) face, that is, a {1-100} face Furthermore, a face passing a pair of edge lines that are not adjacent to each other is an a-face equivalent to a (11-20) face, that is, a {11-20} face. The normal line directions of the m-face and the a-face are perpendicular to the <000-1> direction. Both silicon (Si) atoms and carbon (C) atoms are arranged on the m-face and the a-face.

Hereinafter, a case will be described where the first face of the SiC substrate 12 is inclined at an angle of 0° to 10° with respect to the silicon face, and the second face is inclined at an angle of 0° to 10° with respect to the carbon face. The face inclined at an angle of 0° to 10° with respect to the silicon face and the face inclined at an angle of 0° to 10° with respect to the carbon face are respectively can be regarded equivalent to the silicon face and the carbon face in terms of the characteristics.

An n$^-$-type drift layer (SiC layer) 14, in which the impurity concentration of the n-type impurity is, for example, $1\times10^{15}$ or more and $1\times10^{17}$ cm$^{-3}$ or less, is formed on the first face of the SiC substrate 12. The drift layer 14 is, for example, a SiC epitaxial growth layer formed on the SiC substrate 12 by the epitaxial growth.

The surface of the drift layer 14 is also inclined at an angle of 0° to 10° with respect to the silicon face. The layer thickness of the drift layer 14 is, for example, 3 μm or more and 100 μm or less.

A p-type p-well region 16, in which the impurity concentration of the p-type impurity is, for example, $5\times10^{15}$ cm$^{-3}$ or more and $1\times10^{18}$ cm$^{-3}$ or less, is formed on a part of the surface of the drift layer 14. The depth of the p-well region 16 is, for example, about 0.6 μm. The p-well region 16 functions as a channel region of the MISFET 100.

An n$^+$-type source region 18, in which the impurity concentration of the n-type impurity is, for example, $1\times10^{18}$ cm$^{-3}$ or more and $1\times10^{22}$ cm$^{-3}$ or less, is formed on a part of the surface of the p-well region 16. The depth of the source region 18 is shallower than that of the p-well region 16 and, for example, about 0.3 μm.

Furthermore, a p$^+$-type p-well contact region 20, in which the impurity concentration of the p-type impurity is, for example, $1\times10^{18}$ cm$^{-3}$ or more and $1\times10^{22}$ cm$^{-3}$ or less, is formed on a part of the surface of the p-well region 16 that is a side of the source region 18. The depth of the p-well contact region 20 is shallower than that of the p-well region 16 and, for example, about 0.3 μm.

The MISFET 100 includes a gate insulating layer 28 that is continuously formed on the surfaces of the drift layer 14 and the p-well regions 16 and covers over the layer and the regions. The gate insulating layer 28 is formed on a surface inclined at an angle of 0° to 10° with respect to a {0001} face.

For example, a silicon oxide film or a high-k insulating film is applicable to the gate insulating layer 28. In order to suppress the leakage current of the gate insulating layer 28, a silicon oxide film having a larger band gap than a high-k insulating film is preferably applied.

Furthermore, a gate electrode 30 is formed on the gate insulating layer 28. The gate electrode 30 is, for example, polycrystalline silicon doped with the n-type impurity or the p-type impurity. The n-type impurity is, for example, phosphorus (P) or arsenic (As). The p-type impurity is, for example, boron (B). An interlayer insulating film 32 formed by, for example, a silicon oxide film is formed on the gate electrode 30.

The p-well region 16 below the gate electrode 30 and between the source region 18 and the drift layer 14 functions as a channel region of the MISFET 100.

The gate insulating layer 28 is provided between the gate electrode 30 and the drift layer 14. Furthermore, a first interface region (first region) 40 is provided on the interface between the drift layer 14 and the gate insulating layer 28. The first interface region 40 includes nitrogen (N) and fluorine (F).

Nitrogen (N) and fluorine (F) segregates on, for example, the interface between the drift layer 14 and the gate insulating layer 28. The first interface region 40 has a peak of nitrogen (N) concentration distribution and a peak of fluorine (F) concentration distribution.

The maximum concentration of the peak of the nitrogen concentration distribution in the first interface region 40 is preferably $1\times10^{19}$ cm$^{-3}$ or more, and more preferably $1\times10^{20}$ cm$^{-3}$ or more. The maximum concentration of the peak of the fluorine concentration distribution in the first interface region 40 is $1\times10^{18}$ cm$^{-3}$ or more, and more preferably $5\times10^{18}$ cm$^{-3}$ or more Moreover, the full width at half maximum of the peak of the nitrogen concentration distribution in the first interface region 40 and the peak of the fluorine concentration distribution in the first interface region 40 is preferably 20 nm or less, and more preferably 10 nm or less.

The concentration of nitrogen or fluorine in the first interface region 40 can be measured by the secondary ion mass spectrometry (SIMS). In the SIMS measurement, an insulating film (silicon oxide film) is used as a sensitivity reference to measure concentration of an element in the first interface region 40.

Nitrogen in the first interface region 40 is substituted for silicon (Si) in the top layer of the drift layer (the SiC layer) 14 and forms a termination structure. By substituting trivalent nitrogen for tetravalent silicon, the dangling bond in the interface is terminated. Fluorine in the first interface region 40 is bonded to the dangling bond of silicon (Si) in the top layer of the drift layer (the SiC layer) 14 and forms the termination structure.

A second interface region (second region) 60 is provided between the gate insulating layer 28 and the gate electrode 30. The second interface region 60 has a peak of fluorine (F) concentration distribution.

The maximum concentration of the peak of the fluorine concentration distribution in the second interface region 60 is $1\times10^{18}$ cm$^{-3}$ or more, and more preferably $5\times10^{18}$ cm$^{-3}$ or more.

The MISFET 100 includes a conductive source electrode 34 to be electrically connected to the source region 18 and the p-well contact region 20. The source electrode 34 also functions as a p-well electrode that applies a potential to the p-well region 16.

The source electrode 34 is constituted by a stack of, for example, a nickel (Ni) barrier metal layer and an aluminum (Al) metal layer on the barrier metal layer. The Ni barrier metal layer and the Al metal layer may form an alloy by a reaction.

A conductive drain electrode 36 is formed on a side of the SiC substrate 12 that is the opposite side of the drift layer 14, that is, on the second face side. The drain electrode 36 is constituted by a stack of, for example, a nickel (Ni) barrier metal layer and an aluminum (Al) metal layer on the barrier metal layer. The Ni barrier metal layer and the Al metal layer may form an alloy by a reaction.

Note that, in the present embodiment, the n-type impurity is preferably, for example, nitrogen (N) or phosphorus (P), but arsenic (As) or antimony (Sb) is also applicable. The p-type impurity is preferably, for example, aluminum (Al), but boron (B), gallium (Ga), or indium (In) is also applicable.

Next, a method for manufacturing the semiconductor device of the present embodiment will be described. The method for manufacturing the semiconductor device of the present embodiment includes forming the gate insulating layer on the SiC layer, performing first heat treatment in a nitriding gas atmosphere, depositing polycrystalline silicon including the n-type impurity or the p-type impurity on the gate insulating layer, implanting fluorine ions into polycrystalline silicon, and performing second heat treatment to activate the n-type impurity or the p-type impurity.

FIGS. 3 to 9 are schematic sectional views illustrating the semiconductor device during a manufacturing process in the method for manufacturing the semiconductor device of the present embodiment.

First, the $n^+$-type SiC substrate 12 having the first face inclined at an angle of 0° to 10° with respect to the silicon face and the second face inclined at an angle of 0° to 10° with respect to the carbon face is prepared. Next, the $n^-$-type drift layer (SiC layer) 14 is formed on the first face of the SiC substrate 12 by the epitaxial growth method. The surface of the drift layer 14 is also inclined at an angle of 0° to 10° with respect to the silicon face.

Figure 3:
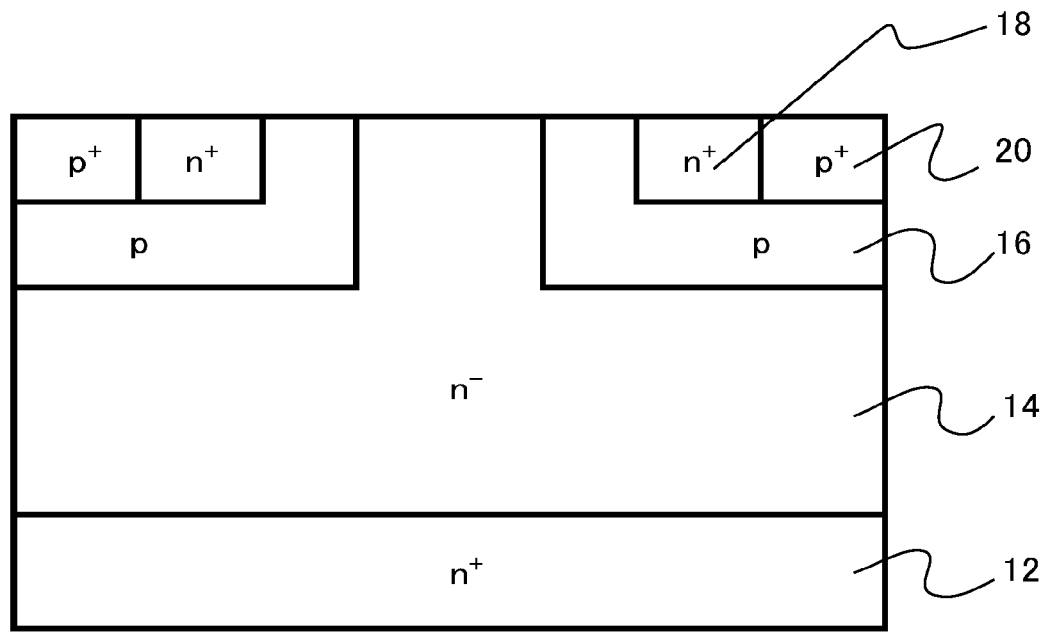
FIG. 3 is a schematic sectional view illustrating a semiconductor device in a method of the first embodiment.

Next, the p-type p-well region 16, the $n^+$-type source region 18, and the $p^+$-type p-well contact region 20 are formed by a known photolithography method and ion implantation method (FIG. 3).

Figure 4:
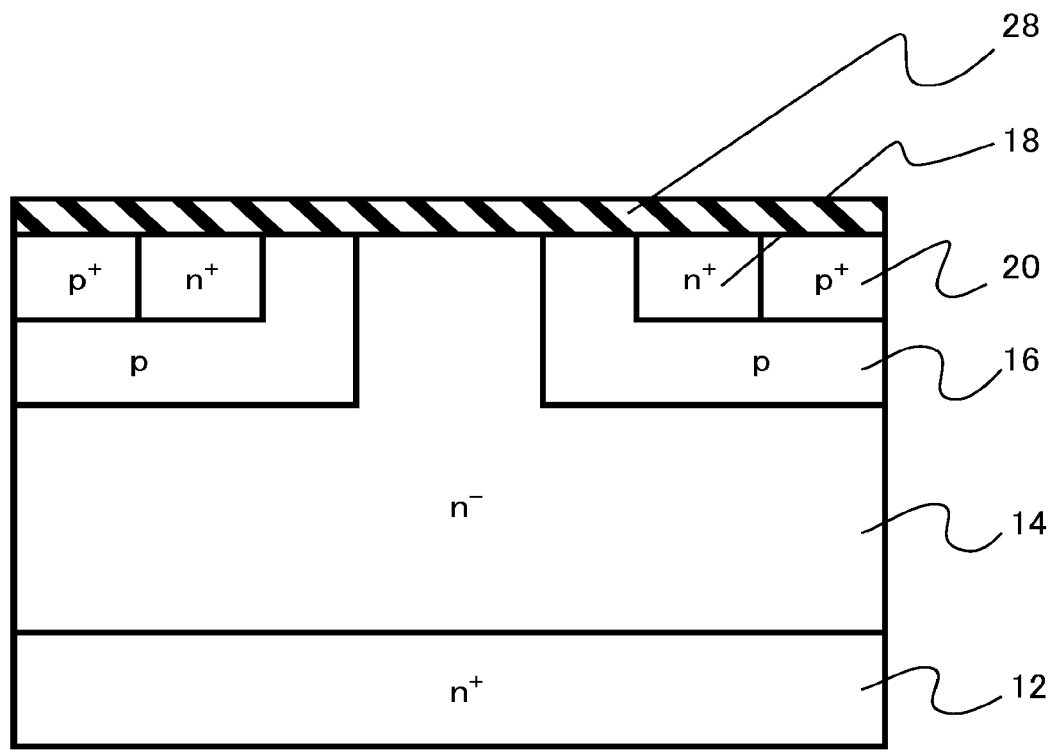
FIG. 4 is a schematic sectional view illustrating the semiconductor device in the method.

Next, the gate insulating layer 28 is formed on the surface of the $n^-$-type drift layer (SiC layer) 14 (FIG. 4). The gate insulating layer 28 is, for example, a silicon oxide film deposited by a low pressure chemical vapor deposition (LPCVD) method. The gate insulating layer 28 may be a thermal oxide film formed by a thermal oxidation method.

After forming the gate insulating layer 28, annealing may be performed to densify the gate insulating layer 28. The annealing is performed, for example, under an atmosphere of inert gas, such as nitrogen or argon, at a temperature of 1000° C. to 1300° C.

Figure 5:
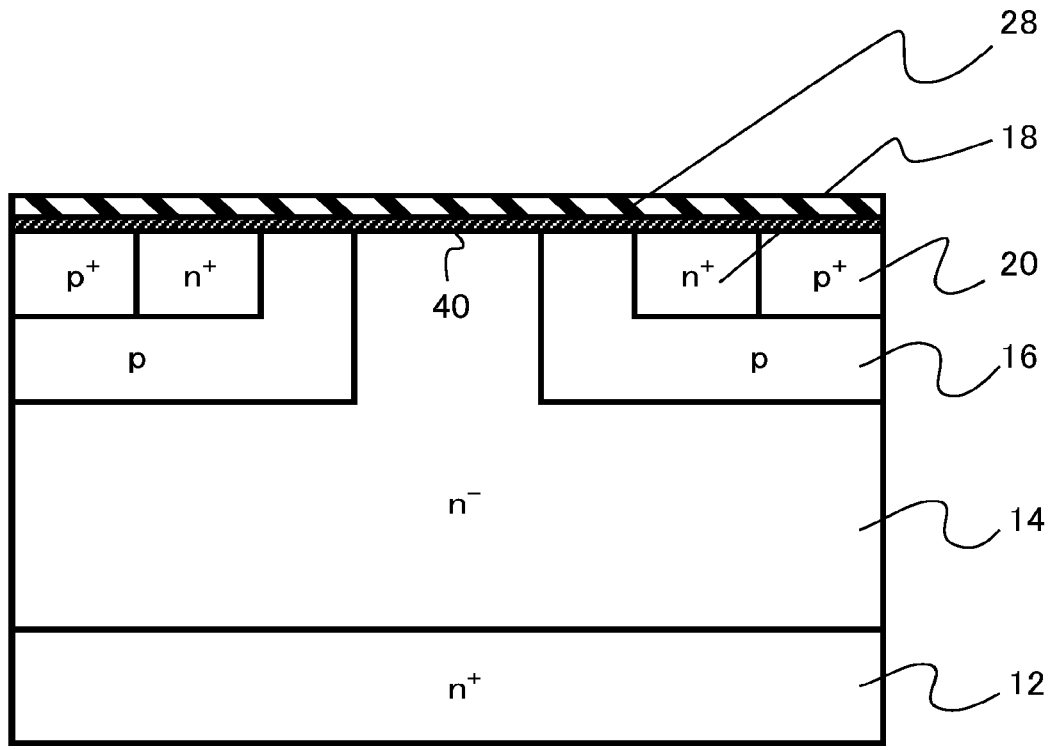
FIG. 5 is a schematic sectional view illustrating the semiconductor device in the method.

Next, nitriding treatment (first heat treatment) is performed in a nitriding gas atmosphere, and the first interface region (the first region) 40 is formed (FIG. 5). The nitriding gas is, for example, thermal nitriding. The nitriding gas is, for example, nitric oxide (NO), nitrous oxide ($N_2O$), or ammonia ($NH_3$). The nitriding treatment temperature is, for example, 1000° C. or more and 1300° C. or less.

By the nitriding treatment, the interface between the drift layer 14 and the gate insulating layer 28 is nitrided. Specifically, nitrogen is substituted for silicon on the surface of the drift layer 14 and forms the termination structure.

Note that, the heat treatment in the nitriding gas atmosphere (the first heat treatment) may be performed before forming the gate insulating layer 28. When NO gas or $N_2O$ gas is used as the nitriding gas, the heat treatment in the nitriding gas atmosphere (the first heat treatment) may be performed to form the gate insulating layer 28.

Figure 6:
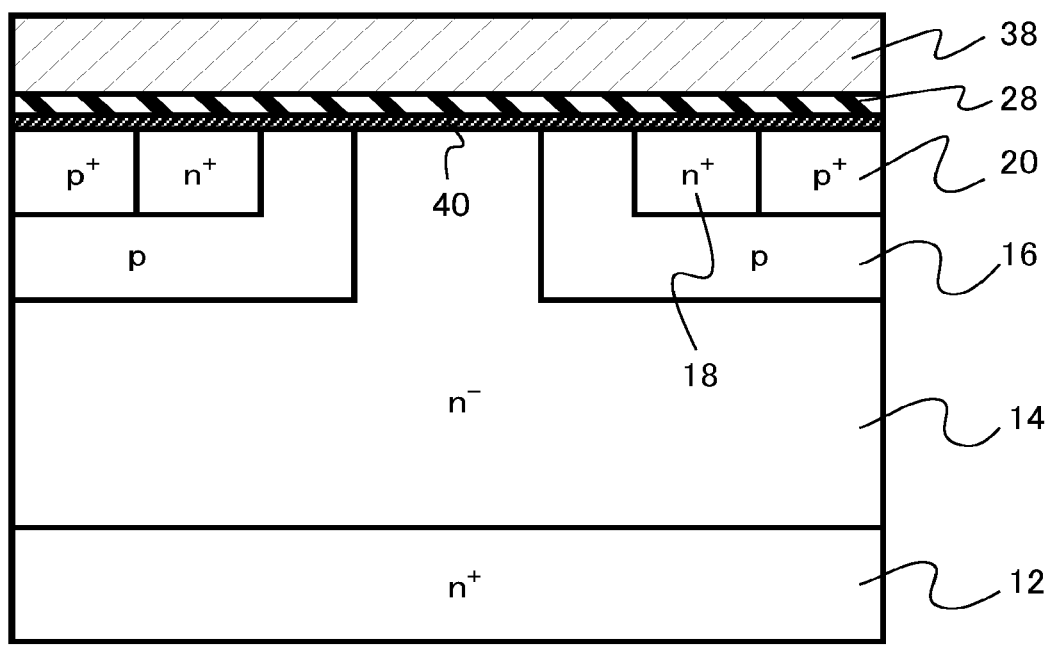
FIG. 6 is a schematic sectional view illustrating the semiconductor device in the method.

Next, the polycrystalline silicon 38 including the n-type impurity or the p-type impurity is deposited on the gate insulating layer 28 by a known process (FIG. 6). The n-type impurity is, phosphorus (P) or arsenic (As). The p-type impurity is, for example, boron (B). The polycrystalline silicon 38 is formed by, for example, the LPCVD method.

Figure 7:
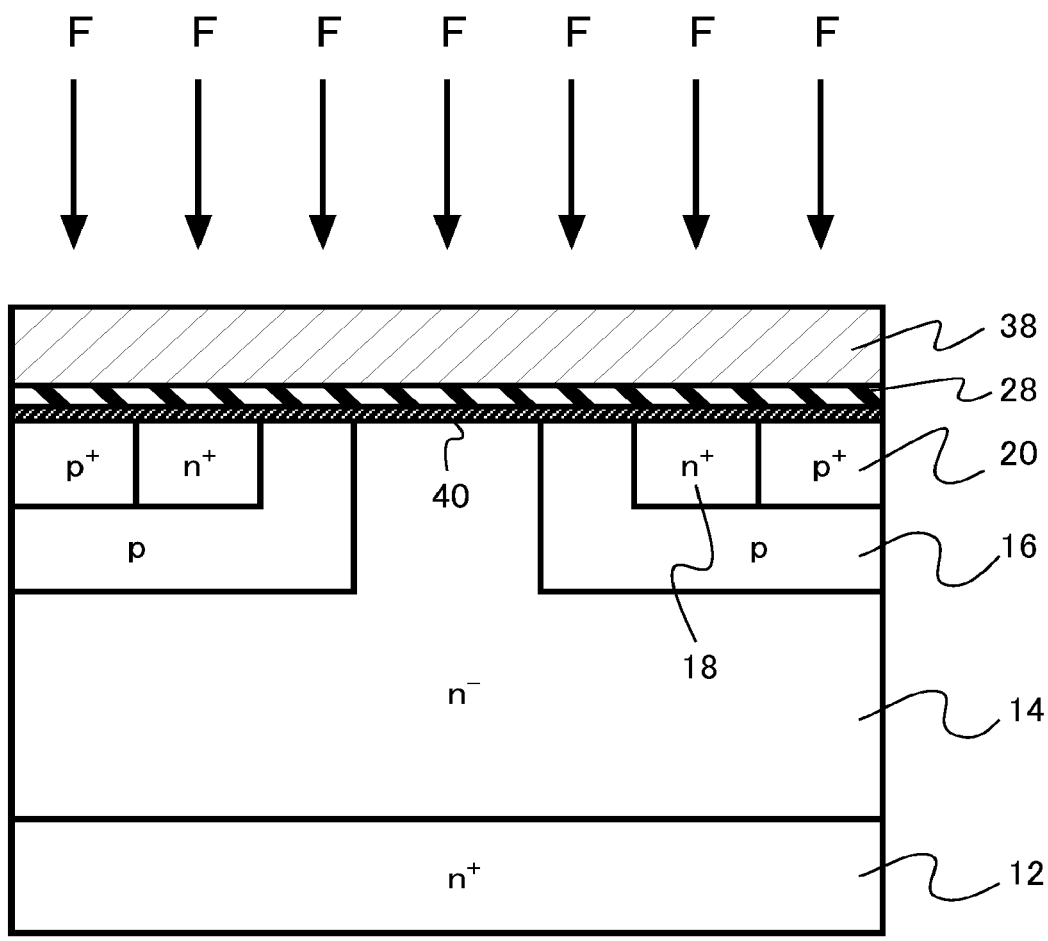
FIG. 7 is a schematic sectional view illustrating the semiconductor device in the method.

Next, fluorine ions are implanted into the polycrystalline silicon 38 (FIG. 7). Next, activation annealing (second heat treatment) to activate the n-type impurity or the p-type impurity in the polycrystalline silicon 38 is performed The activation annealing is performed in, for example, a non-oxidizing atmosphere. The activation annealing is performed in, for example, a forming gas (FG) atmosphere. The activation annealing temperature is, for example, 800° C. or more and 1100° C. or less.

The activation annealing cause fluorine introduced into the polycrystalline silicon 38 to be diffused and segregate on the interface between the drift layer 14 and the gate insulating layer 28, that is, on the first interface region (the first region) 40. More specifically, fluorine is bonded to the dangling bond in the interface between the drift layer 14 and the gate insulating layer 28 and distributed in the interface.

Figure 8:
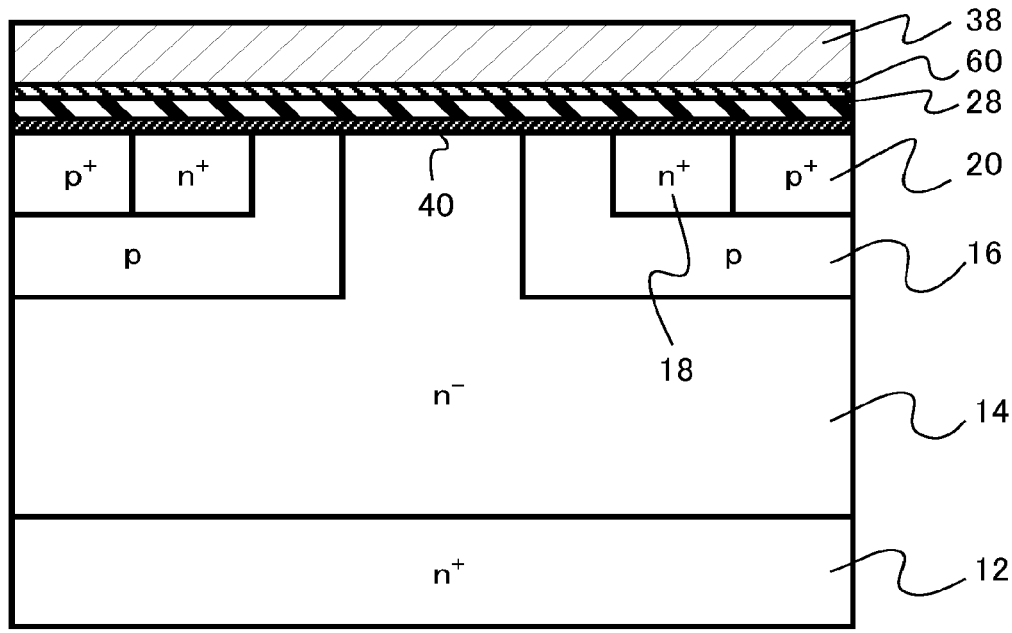
FIG. 8 is a schematic sectional view illustrating the semiconductor device in the method.

Furthermore, the activation annealing causes fluorine to segregate on the interface between the gate insulating layer 28 and the polycrystalline silicon 38, that is, on the second interface region (the second region) 60 (FIG. 8).

Figure 9:
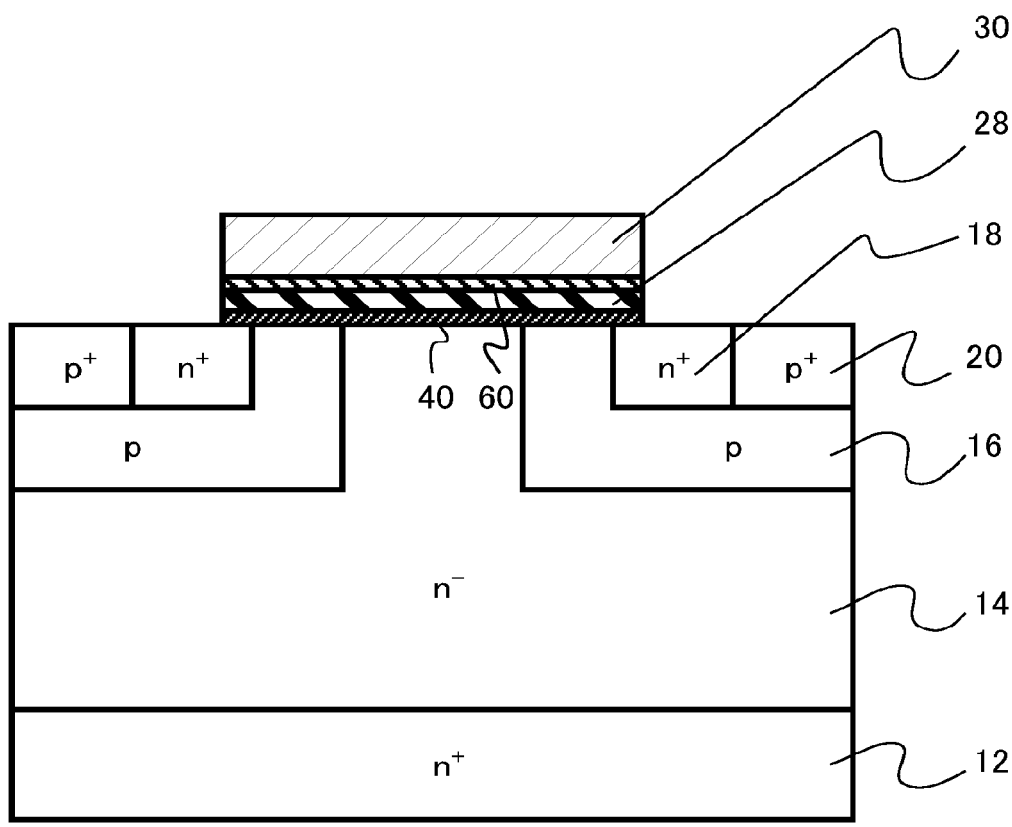
FIG. 9 is a schematic sectional view illustrating the semiconductor device in the method.

Next, the polycrystalline silicon 38 is patterned and the gate electrode 30 is formed by a known process (FIG. 9). Thereafter, the interlayer insulating film 32, the source electrode 34, and the drain electrode 36 are formed by a known process, and the MISFET 100 of the present embodiment illustrated in FIG. 1 is manufactured.

Note that, third heat treatment of 900° C. or more is performed after forming the gate electrode 30. The third heat treatment is, for example, silicide annealing in the case where the source electrode 34 or the drain electrode 36 is formed with silicide. Furthermore, the third heat treatment is, for example, annealing to densify the interlayer insulating film 32. The third heat treatment temperature is higher than the activation annealing (the second heat treatment) temperature. The third heat treatment is performed, for example, at 1000° C. or more and 1200° C. or less.

Hereinafter, a function and an effect of the semiconductor device of the present embodiment will be described.

Figure 10A:
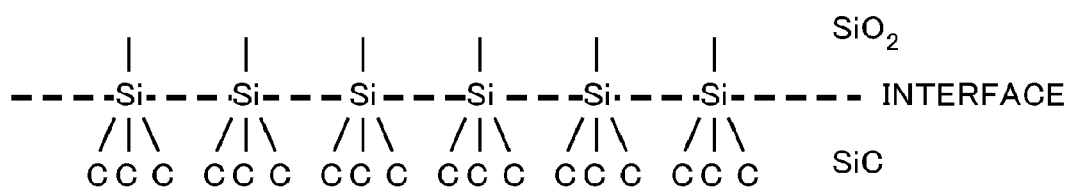
FIGS. 10A, 10B and 10C are diagrams for explaining a function and an effect of the first embodiment.
Figure 10B:
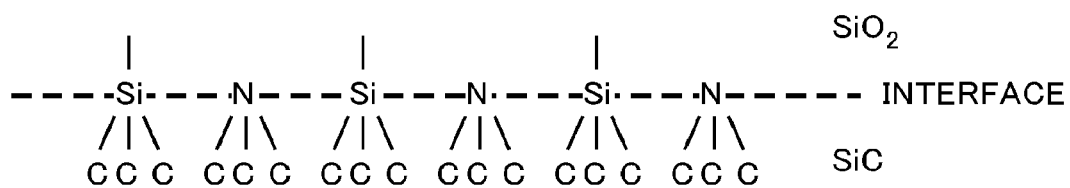
Figure 10C:
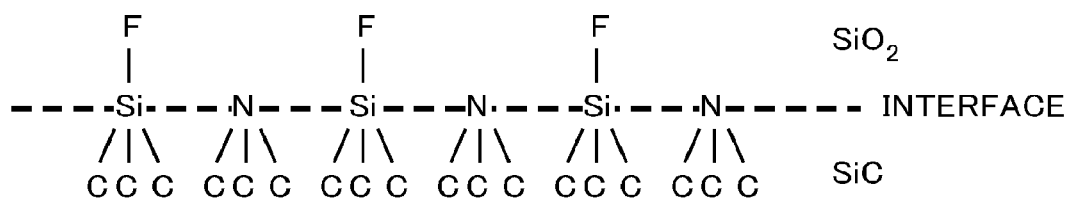

FIGS. 10A, 10B, 10C are graphs for explaining the function and the effect of the semiconductor device of the present embodiment. States near the interface of the MIS structure using SiC are schematically illustrated. In FIGS. 10A, 10B, and 10C, the case where the surface of SiC is the Si-face and the gate insulating layer is a silicon oxide film is illustrated.

In the MIS structure using SiC, one of the causes that the high mobility cannot be achieved is that the dangling bond existing in the interface forms the interface state as illustrated in FIG. 10A.

As a method for terminating the dangling bond existing in the interface, the dangling bond in the interface can be terminated with nitrogen by substituting trivalent nitrogen for tetravalent silicon on the SiC surface as illustrated in FIG. 10B. However, with the method, it is difficult to terminate all of the dangling bonds on the surface of SiC due to coulomb repulsion among nitrogen atoms or distortion caused by substituting nitrogen for silicon.

In the semiconductor device of the present embodiment, in addition to the termination with nitrogen, the dangling bond of remaining silicon is terminated with univalent fluorine as illustrated in FIG. 10C. With the termination structure, the amount of the dangling bonds in the interface is reduced and the amount of the interface state is also reduced. Consequently, the MISFET 100 having high mobility can be implemented.

Figure 11A:
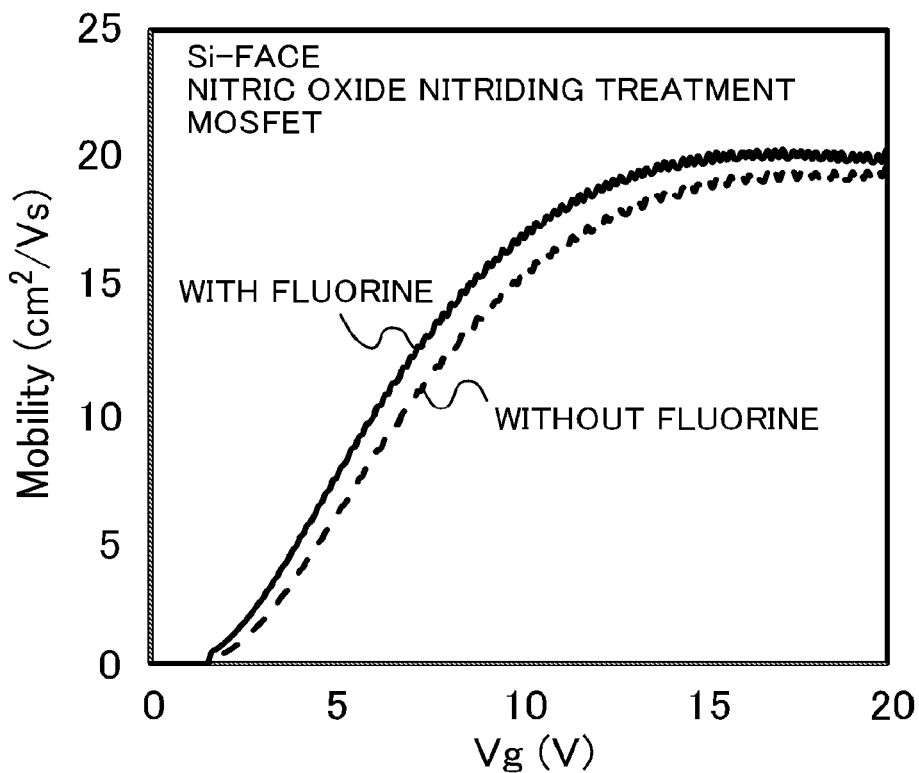
FIGS. 11A and 11B are graphs for explaining a function and an effect of the first embodiment.
Figure 11B:
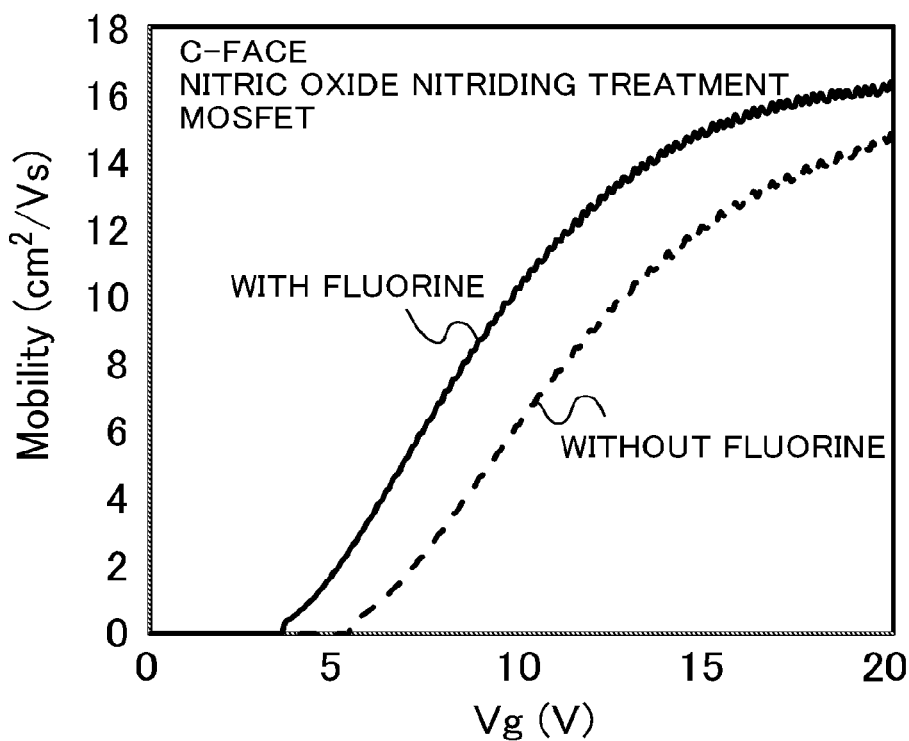

FIGS. 11A and 11B are graphs for explaining a function and an effect of the semiconductor device of the present embodiment. The mobility of the MOSFET in the cases where fluorine is introduced into the interface and where fluorine is not introduced into the interface is illustrated. FIG. 11A is the case where the surface of SiC is the Si-face and FIG. 11B is the case where the surface of SiC is the C-face.

The gate insulating layer 28 is a deposition film of a silicon oxide film. The nitriding treatment is performed in a 100% NO atmosphere at 1250° C. The gate electrode 30 is polycrystalline silicon doped with phosphorus. The activation annealing to activate phosphorus and diffuse fluorine is performed in the FG atmosphere at 900° C.

As is apparent from FIGS. 11A and 11B, by causing fluorine to segregate on the interface, the mobility is improved in both of the cases of Si-face and C-face.

Figure 12:
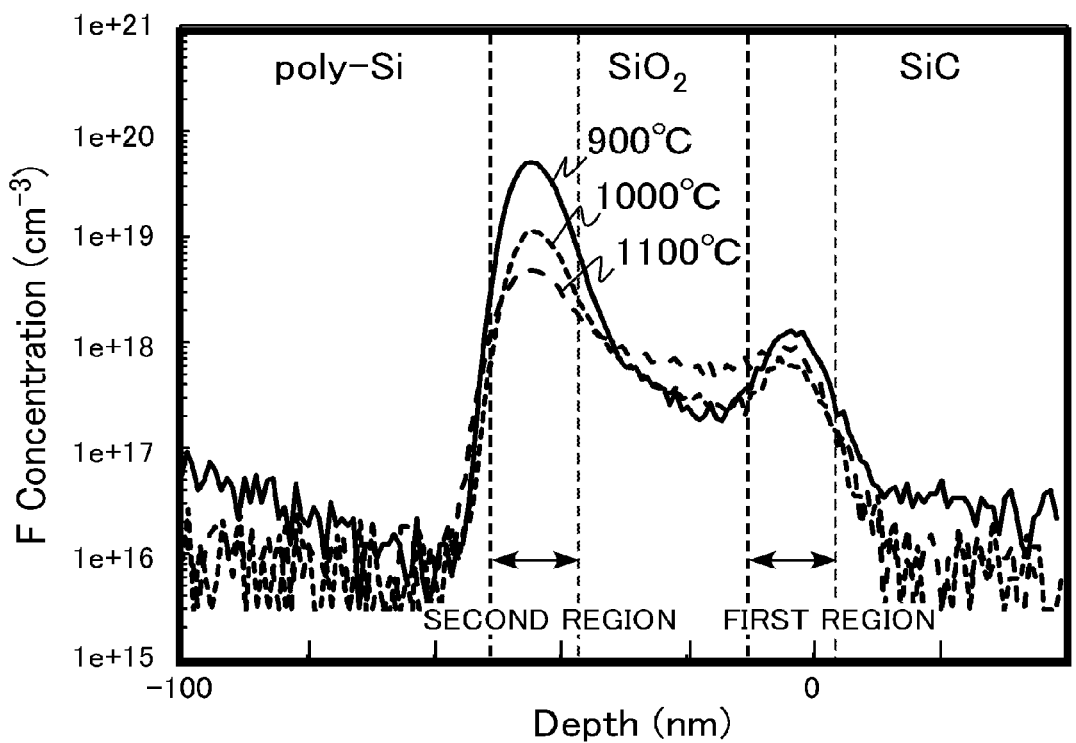
FIG. 12 is a graph for explaining a function and an effect of the first embodiment.

FIG. 12 is a graph for explaining a function and an effect of the semiconductor device of the present embodiment. A fluorine concentration profile when the temperature of the activation annealing to activate fluorine is changed is indicated.

As illustrated in FIG. 12, in any case where the activation annealing temperature is 900° C., 1000° C., or 1100° C., the existence of the first interface region (the first region) 40 on which fluorine segregates and the second interface region (the first region) 60 on which fluorine segregates are confirmed. Consequently, the bond between the dangling bond and fluorine has high heat resistance, and fluorine is hardly desorbed in a high temperature process of 1100° C.

Figure 13:
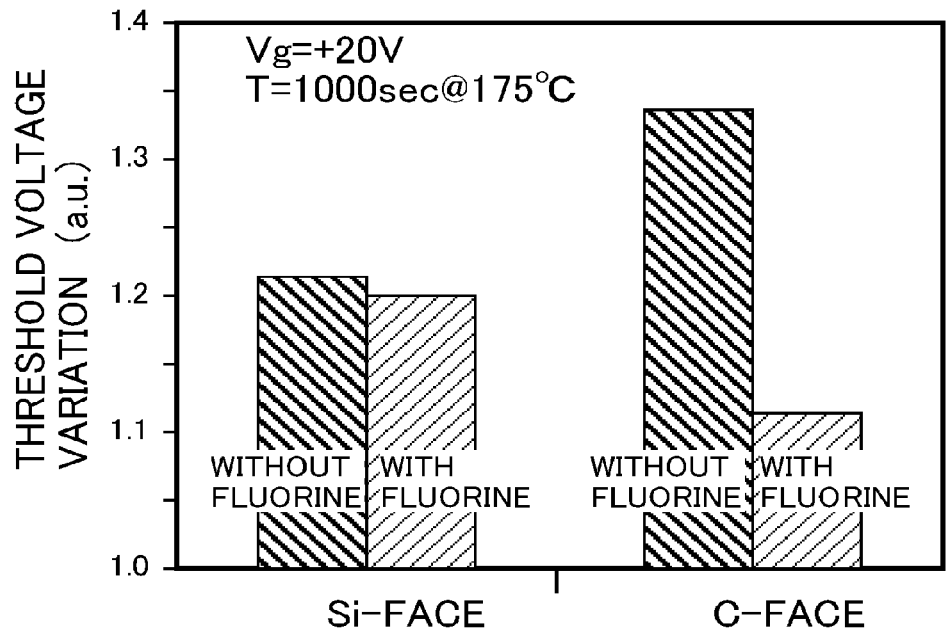
FIG. 13 is a graph for explaining a function and an effect of the first embodiment.

FIG. 13 is a graph for explaining a function and an effect of the semiconductor device of the present embodiment. Threshold voltage variation after applying electrical stress to the MIS structure is illustrated. The case where fluorine is introduced in to the interface and fluorine is not introduced in to the interface of the Si-face and the C-face is illustrated. The applied voltage is +20V with respect to the gate electrode, the voltage applying time is 1000 seconds, and the voltage applying temperature is 175° C.

As is apparent from FIG. 13, by causing fluorine to segregate on the interface, the threshold voltage variation is reduced in both of the cases of Si-face and C-face. This is because that fluorine is hardly desorbed due to the high electrical stress resistance of the bond between the dangling bond and fluorine and the amount of the interface state is hardly changed.

It is considered that the interface state that affects the mobility of the MISFET is a shallow level where the energy level (Ec–Eit20V) from a conduction band edge is, for example, 0.2 eV.

The area density of the interface state of the interface between the SiC layer and the silicon oxide film (@Ec–Eit=0.2 eV) is at least about $1 \times 10^{12}$ cm$^{-2}$. In order to reduce the interface state by the termination structure with nitrogen, nitrogen in an amount equivalent to the area density of at least $1 \times 10^{12}$ cm$^{-2}$ preferably exists in the first interface region 40.

When it is assumed that nitrogen in an amount equivalent to the area density is distributed in the 1 nm thick first interface region 40, the concentration of nitrogen is $1 \times 10^{19}$ cm$^{-3}$. Thus, the maximum concentration of the peak of the nitrogen concentration distribution in the first interface region 40 is preferably $1 \times 10^{19}$ cm$^{-3}$ or more. In order to sufficiently terminate the dangling bond, the maximum concentration of the peak of the nitrogen concentration distribution in the first interface region 40 is preferably $1 \times 10^{20}$ cm$^{-3}$ or more.

However, it is difficult to reduce the area density of the interface state to $1 \times 10^{11}$ cm$^{-7}$ or less only with the termination of the dangling bond with nitrogen. Thus, fluorine in an amount equivalent to the area density of $1 \times 10^{11}$ cm$^{-2}$ preferably exists in the first interface region 40.

When it is assumed that fluorine in an amount equivalent to the area density is distributed in the 1 nm thick first interface region 40, the concentration of fluorine is $1 \times 10^{18}$ cm$^{-3}$. Thus, the maximum concentration of the peak of the fluorine concentration distribution in the first interface region 40 is preferably $1 \times 10^{18}$ cm$^{-3}$ or more. In order to sufficiently terminate the dangling bond, the maximum concentration of the peak of the fluorine concentration distribution in the first interface region 40 is more preferably $1 \times 10^{19}$ cm$^{-3}$ or more.

Furthermore, the semiconductor device of the present embodiment includes the second interface region (the second region) 60 between the gate insulating layer 28 and the gate electrode 30. The second interface region 60 includes fluorine.

A part of the n-type impurity or the p-type impurity included in the polycrystalline silicon gate electrode 30 is diffused to the gate insulating layer 28 side when the activation annealing is performed. For example, phosphorus (P) or boron (B) that is the impurity forms a defect by being introduced into the gate insulating layer 28, and which may cause the reliability deterioration of the gate insulating layer 28.

By providing the second interface region (the second region) 60 including fluorine, it is possible to deactivate the defect formed in the gate insulating layer 28 by, for example, phosphorus (P) or boron (B). Consequently, the reliability of the gate insulating layer 28 is improved.

As described above, according to the present embodiment, the interface state between the SiC layer and the gate insulating layer is reduced, and the MISFET 100 having high mobility can be implemented. Furthermore, by applying fluorine that is strongly bonded to the dangling bond to the termination structure and causing fluorine to segregate between the gate insulating layer and the gate electrode, the MISFET 100 having high reliability can be implemented.

Note that, it has been described the case where the surface of the SiC layer 14 is the Si-face in the present embodiment. Even if the surface of the SiC layer 14 is, for example, the C-face, the m-face, the a-face, or other face orientation, a similar effect can be obtained. When carbon atoms are arranged on the surface of the SiC layer 14, the dangling bonds are reduced by substituting nitrogen for carbon.

(Second Embodiment)

A semiconductor device of the present embodiment is different from that of the first embodiment in that the semiconductor device is a trench gate-type MISFET. Hereinafter, the description overlapping with the first embodiment will be omitted.

Figure 14:
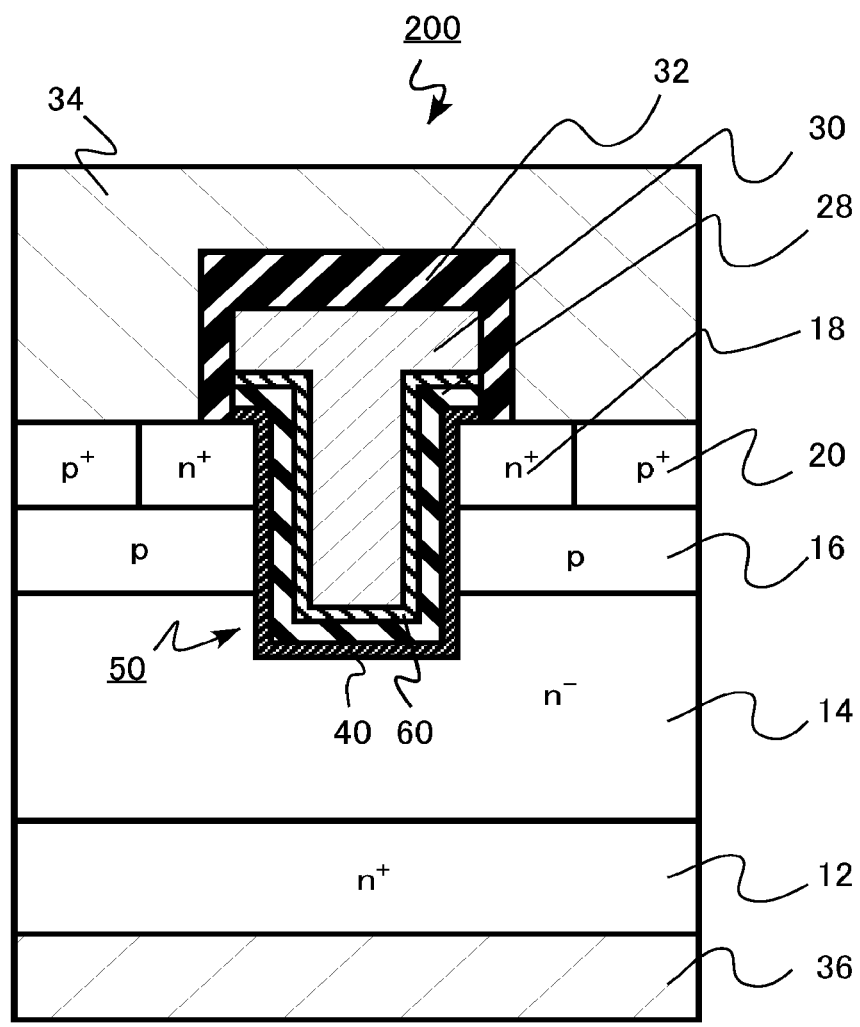
FIG. 14 is a schematic sectional view illustrating a semiconductor device of a second embodiment.

FIG. 14 is a schematic sectional view illustrating a MISFET that is the semiconductor device of the present embodiment. A MISFET 200 is a trench gate-type MISFET in which a gate insulating layer and a gate electrode are provided in a trench.

The MISFET 200 includes an n$^+$-type SiC substrate 12 having a first face and a second face. In FIG. 14, the first face is an upper face of the diagram, and the second face is a lower face of the diagram. The first face of the SiC substrate 12 is inclined at an angle of 0° to 10° with respect to a silicon face, and the second face is inclined at an angle of 0° to 10° with respect to a carbon face.

The SiC substrate 12 is a 4H—SiC substrate including, for example, nitrogen (N) as an n-type impurity, and the impurity concentration is, for example, $1 \times 10^{18}$ cm$^{-3}$ or more and $1 \times 10^{20}$ cm$^{-3}$ or less.

An n$^-$-type SiC layer (drift layer) 14, in which the impurity concentration of an n-type impurity is, for example, $1 \times 10^{15}$ or more and $1 \times 10^{17}$ cm$^{-3}$ or less, is formed on the first face of the SiC substrate 12. The drift layer 14 is, for example, an epitaxial growth layer formed on the SiC substrate 12 by the epitaxial growth.

The surface of the drift layer 14 is inclined at an angle of 0° to 10° with respect to the silicon face. The layer thickness of the drift layer 14 is, for example, 3 μm or more and 100 μm or less.

A p-type p-well region 16, in which the impurity concentration of the p-type impurity is, for example, $5 \times 10^{15}$ cm$^{-3}$ or more and $1 \times 10^{18}$ cm$^{-3}$ or less, is formed on a part of the surface of the drift layer 14. The depth of the p-well region 16 is, for example, about 0.6 μm. The p-well region 16 functions as a channel region of the MISFET 200.

An n$^+$-type source region 18, in which the impurity concentration of the n-type impurity is, for example, $1 \times 10^{18}$ cm$^{-3}$ or more and $1 \times 10^{22}$ cm$^{-3}$ or less, is formed on a part of the surface of the p-well region 16. The depth of the source region 18 is shallower than that of the p-well region 16 and, for example, about 0.3 μm.

Furthermore, a p$^+$-type p-well contact region 20, in which the impurity concentration of the p-type impurity is, for example, $1 \times 10^{18}$ cm$^{-3}$ or more and $1 \times 10^{22}$ cm$^{-3}$ or less, is formed on a part of the surface of the p-well region 16 that is a side of the source region 18. The depth of the p-well contact region 20 is shallower than that of the p-well region 16 and, for example, about 0.3 μm.

A trench 50 is provided in the direction from the surface of the drift layer 14 to the SiC substrate 12. The inner wall face of the trench 50 is, for example, the m-face or the a-face. Both silicon (Si) atoms and carbon (C) atoms are arranged on the m-face and the a-face.

The MISFET 200 includes a gate insulating layer 28 that is continuously formed on the surfaces of the drift layer 14, the p-well regions 16, and the surfaces of the source regions 18 in the trench 50 and covers over the layer and the regions.

Furthermore, a gate electrode 30 is formed on the gate insulating layer 28. The p-well region 16 between the source region 18 and the drift layer 14 on the side face of the trench 50 functions as a channel region of the MISFET 200.

The gate insulating layer 28 is provided between the gate electrode 30 and the p-well region 16. Furthermore, a first interface region (first region) 40 is provided on the interface between the p-well region 16 and the gate insulating layer 28. The first interface region 40 includes nitrogen (N) and fluorine (F).

Nitrogen in the first interface region 40 is substituted for silicon (Si) and carbon (C) on the outermost surface of the p-well region 16 and forms the termination structure. By substituting trivalent nitrogen for tetravalent silicon and carbon, the dangling bond in the interface is terminated. Fluorine in the first interface region 40 is bonded to the dangling bonds of silicon (Si) and carbon (C) in the outermost surface of the p-well region 16 and forms the termination structure.

Furthermore, a second interface region (second region) 60 is provided on the interface between the gate insulating layer 28 and the gate electrode 30. The second interface region 60 has a peak of fluorine (F) concentration distribution.

The MISFET 200 includes a conductive source electrode 34 to be electrically connected to the source region 18 and the p-well contact region 20. The source electrode 34 also functions as a p-well electrode that applies a potential to the p-well region 16. A conductive drain electrode 36 is formed on a side of the SiC substrate 12 that is the opposite side of the drift layer 14, that is, on the second face side.

According to the present embodiment, a similar effect as the first embodiment can be obtained due to the existence of the first and second interface regions. Furthermore, by applying the trench gate structure, it is possible to improve integration degree of the MISFET 200. Moreover, by removing the JFET region, it is possible to reduce conduction losses, and the MISFET 200 having small on-resistance can be implemented.

(Third Embodiment)

A semiconductor device of the present embodiment is similar to that of the first embodiment except that the semiconductor device is not a MISFET but an IGBT. Thus, the description overlapping with the first embodiment will be omitted.

Figure 15:
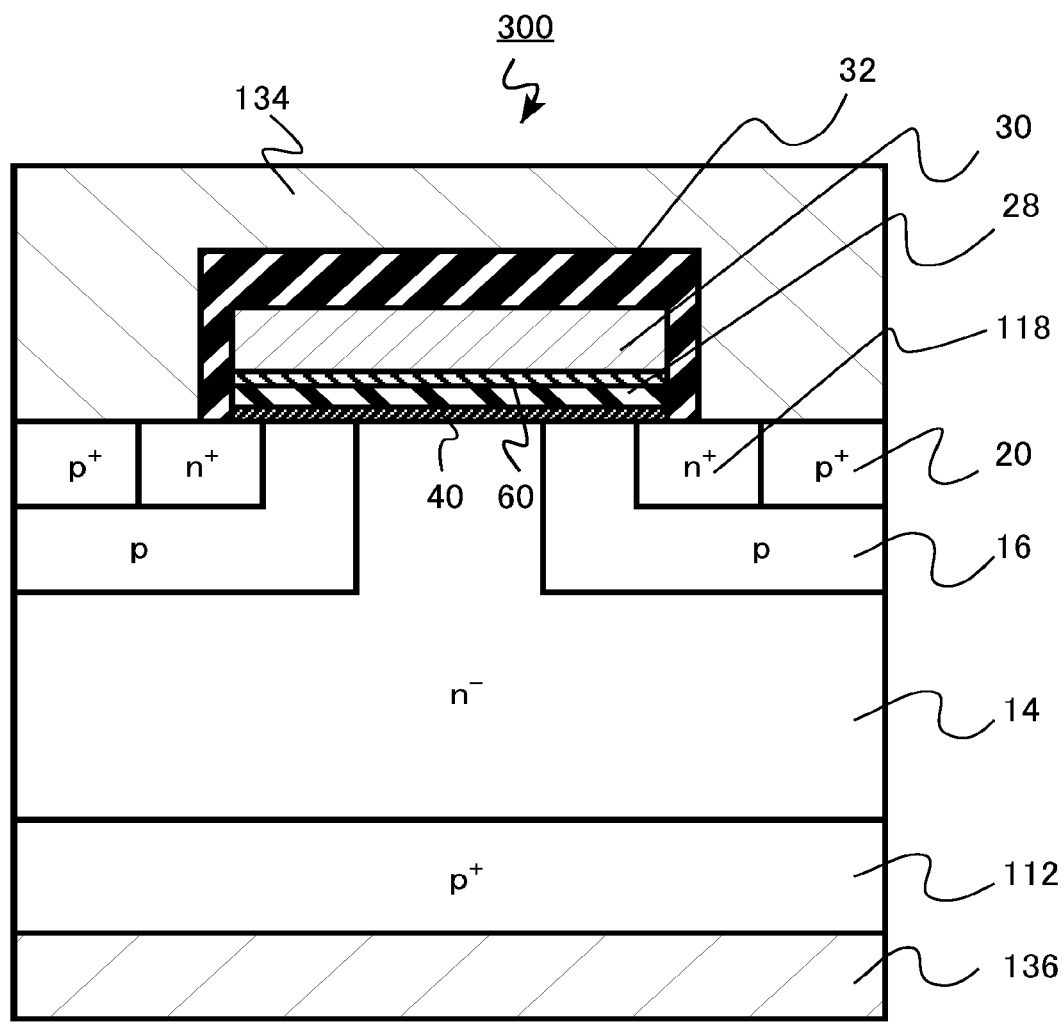
FIG. 15 is a schematic sectional view illustrating a semiconductor device of a third embodiment.

FIG. 15 is a schematic sectional view illustrating an IGBT that is the semiconductor device of the present embodiment.

An IGBT 300 includes a p$^+$-type SiC substrate 112 having a first face and a second face. In FIG. 15, the first face is an upper face of the diagram, and the second face is a lower face of the diagram.

The SiC substrate 112 is a 4H—SiC substrate, in which the impurity concentration is, for example, $1 \times 10^{18}$ cm$^{-3}$ or more and $1 \times 10^{20}$ cm$^{-3}$ or less, including, for example, aluminum (Al) as a p-type impurity.

Hereinafter, a case will be described where the first face of the SiC substrate 112 is inclined at an angle of 0° to 10° with respect to a silicon face, and the second face is inclined at an angle of 0° to 10° with respect to a carbon face. The face inclined at an angle of 0° to 10° with respect to the silicon face and the face inclined at an angle of 0° to 10° with respect to the carbon face are respectively regarded as the silicon face and the carbon face due to the characteristics.

An n$^-$-type drift layer (SiC layer) 14, in which impurity concentration of an n-type impurity is, for example, $1 \times 10^{14}$ or more and $1 \times 10^{16}$ cm$^{-3}$ or less, is formed on the first face of the SiC substrate 112. The drift layer 14 is, for example, an epitaxial growth layer formed on the SiC substrate 112 by the epitaxial growth.

The surface of the drift layer 14 is also inclined at an angle of 0° to 10° with respect to the silicon face. The layer thickness of the drift layer 14 is, for example, 10 μm or more and 300 μm or less.

A p-type p-well region 16, in which the impurity concentration of the p-type impurity is, for example, $5 \times 10^{15}$ cm$^{-3}$ or more and $1 \times 10^{18}$ cm$^{-3}$ or less, is formed on a part of the surface of the drift layer 14. The depth of the p-well region 16 is, for example, about 0.6 μm. The p-well region 16 functions as a channel region of the IGBT 300.

An n$^+$-type emitter region 118, in which the impurity concentration of the n-type impurity is, for example, $1 \times 10^{18}$ cm$^{-3}$ or more and $1 \times 10^{22}$ cm$^{-3}$ or less, is formed on a part of the surface of the p-well region 16. The depth of the emitter region 118 is shallower than that of the p-well region 16 and, for example, about 0.3 μm.

Furthermore, a p$^+$-type p-well contact region 20, in which the impurity concentration of the p-type impurity is, for example, $1 \times 10^{18}$ cm$^{-3}$ or more and $1 \times 10^{22}$ cm$^{-3}$ or less, is formed on a part of the surface of the p-well region 16 that is a side of the emitter region 118. The depth of the p-well contact region 20 is shallower than that of the p-well region 16 and, for example, about 0.3 μm.

The IGBT 300 includes a gate insulating layer 28 that is continuously formed on the surfaces of the drift layer 14 and the p-well regions 16 and covers over the layer and the regions. For example, a silicon oxide film or a high-k insulating film is applicable to the gate insulating layer 28. In order to suppress the leakage current of the gate insulating layer 28, a silicon oxide film having a larger band gap than a high-k insulating film is preferably applied.

Furthermore, a gate electrode 30 is formed on the gate insulating layer 28. The gate electrode 30 is, for example, polycrystalline silicon doped with the n-type impurity or the p-type impurity. The n-type impurity is, for example, phosphorus (P) or arsenic (As). An interlayer insulating film 32 formed by, for example, a silicon oxide film is formed on the gate electrode 30.

The p-well region 16 between the emitter region 118 and the drift layer 14 below the gate electrode 30 functions as a channel region of the IGBT 300.

The gate insulating layer 28 is provided between the gate electrode 30 and the drift layer 14. Furthermore, a first interface region (first region) 40 is provided on the interface between the drift layer 14 and the gate insulating layer 28. The first interface region 40 includes nitrogen (N) and fluorine (F).

Nitrogen (N) and fluorine (F) segregates on, for example, the interface between the drift layer 14 and the gate insulating layer 28. The first interface region 40 has a peak of nitrogen (N) concentration distribution and a peak of fluorine (F) concentration distribution.

The maximum concentration of the peak of the nitrogen concentration distribution in the first interface region 40 is preferably $1\times10^{19}$ cm$^{-3}$ or more, and more preferably $1\times10^{20}$ cm$^{-3}$ or more. Furthermore, the maximum concentration of the peak of the fluorine concentration distribution in the first interface region 40 is $1\times10^{18}$ cm$^{-3}$ or more, and more preferably $5\times10^{18}$ cm$^{-3}$ or more.

Moreover, the full width at half maximum of the peak of the nitrogen concentration distribution in the first interface region 40 and the peak of the fluorine concentration distribution in the first interface region 40 is preferably 20 nm or less, and more preferably 10 nm or less.

The concentration of nitrogen or fluorine in the first interface region 40 can be measured by the secondary ion mass spectrometry (SIMS). An insulating film (silicon oxide film) is used as a sensitivity reference to measure concentration of an element in the first interface region 40.

Nitrogen in the first interface region 40 is substituted for silicon (Si) in the top layer of the drift layer (the SiC layer) 14 and forms a termination structure. By substituting trivalent nitrogen for tetravalent silicon, the dangling bond in the interface is terminated. Fluorine in the first interface region 40 is bonded to the dangling bond of silicon (Si) in the top layer of the drift layer (the SiC layer) 14 and forms the termination structure.

A second interface region (second region) 60 is provided on the interface between the gate insulating layer 28 and the gate electrode 30. The second interface region 60 has a peak of fluorine (F) concentration distribution.

The maximum concentration of the fluorine concentration distribution in the second interface region 60 is $1\times10^{18}$ cm$^{-3}$ or more, and more preferably $5\times10^{18}$ cm$^{-3}$ or more.

The IGBT 300 includes a conductive emitter electrode 134 to be electrically connected to the emitter region 118 and the p-well contact region 20. The emitter electrode 134 also functions as a p-well electrode that applies a potential to the p-well region 16.

The emitter electrode 134 is constituted by a stack of, for example, a nickel (Ni) barrier metal layer and an aluminum (Al) metal layer on the barrier metal layer. The Ni barrier metal layer and the Al metal layer may form an alloy by a reaction.

Furthermore, a conductive collector electrode 136 is formed on a side of the SiC substrate 112 that is the opposite side of the drift layer 14, that is, on the second face side. The collector electrode 136 is constituted by a stack of, for example, a nickel (Ni) barrier metal layer and an aluminum (Al) metal layer on the barrier metal layer. The Ni barrier metal layer and the Al metal layer may form an alloy by a reaction.

According to the present embodiment, a similar function and effect to that of the first embodiment can be obtained due to the existence of the first and second interface regions. Consequently, the IGBT 300 having high operation performance and high reliability can be implemented.

As described above, in the embodiments, while it has been described the case where a crystal structure of silicon carbide is 4H—SiC, the present disclosure is applicable to silicon carbide having a 6H—SiC, 3C—SiC, or other crystal structure.

While certain embodiments have been described, these embodiments have been presented by way of example only, and are not intended to limit the scope of the inventions. Indeed, the semiconductor device and the method for manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a SiC layer;
a gate electrode; and
a gate insulating layer provided between the SiC layer and the gate electrode,
wherein a peak of nitrogen (N) concentration distribution and a peak of fluorine (F) concentration distribution exist substantially at an interface between the SiC layer and the gate insulatinu film.

2. The device according to claim 1, wherein
a maximum concentration of the peak of the nitrogen concentration distribution is $1\times10^{19}$ cm$^{-3}$ or more, and
a maximum concentration of the peak of the fluorine concentration distribution is $1\times10^{18}$ cm$^{-3}$ or more.

3. The device according to claim 1, wherein
a full width at half maximum of the peak of the nitrogen concentration and the peak of the fluorine concentration distribution is 20 nm or less.

4. The device according to claim 1, wherein
a maximum concentration of the peak of the nitrogen concentration distribution is $1\times10^{20}$ cm$^{-3}$ or more, and
a maximum concentration of the peak of the fluorine concentration distribution is $5\times10^{18}$ cm$^{-3}$ or more.

5. The device according to claim 1, wherein the gate insulating layer is a silicon oxide film.

6. The device according to claim 1, wherein the gate electrode is polycrystalline silicon including an n-type impurity or a p-type impurity.

7. The device according to claim 6, further comprising a second region provided between the gate insulating layer and the gate electrode, the second region having a peak of the fluorine (F) concentration distribution.

8. The device according to claim 1,
wherein fluorine atoms are bonded to silicon atoms bonded to carbon atoms, and nitrogen atoms at the interface are bonded to carbon atoms.

9. A semiconductor device comprising:
a SiC layer;
a gate electrode;
a gate insulating layer provided between the SiC layer and the gate electrode; and a first region provided between the SiC layer and the gate insulating layer, the first region having a peak of nitrogen (N) concentration distribution and a peak of fluorine (F) concentration distribution, wherein fluorine atoms in the first region are bonded to silicon atoms bonded to carbon atoms, and nitrogen atoms in the first region are bonded to carbon atoms.

10. The device according to claim 9, wherein
a maximum concentration of the peak of the nitrogen concentration distribution in the first region is $1\times10^{19}$ $cm^{-3}$ or more, and
a maximum concentration of the peak of the fluorine concentration distribution in the first region is $1\times10^{18}$ $cm^{-3}$ or more.

11. The device according to claim 9, wherein
a full width at half maximum of the peak of the nitrogen concentration distribution in the first region and the peak of the fluorine concentration distribution in the first region is 20 nm or less.

12. The device according to claim 9, wherein
a maximum concentration of the peak of the nitrogen concentration distribution in the first region is $1\times10^{20}$ $cm^{-3}$ or more, and
a maximum concentration of the peak of the fluorine concentration distribution in the first region is $5\times10^{18}$ $cm^{-3}$ or more.

13. The device according to claim 9, wherein the gate insulating layer is a silicon oxide film.

14. The device according to claim 9, wherein the gate electrode is polycrystalline silicon including an n-type impurity or a p-type impurity.

15. The device according to claim 14, further comprising a second region provided between the gate insulating layer and the gate electrode, the second region having a peak of the fluorine (F) concentration distribution.

* * * * *